(12) United States Patent
Griebenow

(10) Patent No.: US 8,324,039 B2
(45) Date of Patent: Dec. 4, 2012

(54) REDUCED SILICON THICKNESS OF N-CHANNEL TRANSISTORS IN SOI CMOS DEVICES

(75) Inventor: Uwe Griebenow, Markkleeberg (DE)

(73) Assignee: Globalfoundries Inc., Grand Cayman (KY)

( * ) Notice: Subject to any disclaimer, the term of this patent is extended or adjusted under 35 U.S.C. 154(b) by 289 days.

(21) Appl. No.: 12/776,742

(22) Filed: May 10, 2010

(65) Prior Publication Data

US 2010/0289081 A1 Nov. 18, 2010

(30) Foreign Application Priority Data

May 15, 2009 (DE) .......................... 10 2009 021 480

(51) Int. Cl.
*H01L 21/8234* (2006.01)
(52) U.S. Cl. .......................... 438/197; 438/128; 438/199
(58) Field of Classification Search .................. 438/128, 438/197, 199
See application file for complete search history.

(56) References Cited

U.S. PATENT DOCUMENTS

| | | | |
|---|---|---|---|
| 5,940,691 A | 8/1999 | Manning | 438/151 |
| 6,936,506 B1 | 8/2005 | Buller et al. | 438/197 |
| 7,282,402 B2 | 10/2007 | Sadaka et al. | 438/221 |
| 2006/0086987 A1 | 4/2006 | Chen et al. | 257/369 |
| 2006/0228851 A1* | 10/2006 | Sadaka et al. | 438/221 |
| 2008/0293225 A1* | 11/2008 | Suguro | 438/513 |
| 2010/0164006 A1* | 7/2010 | Kirkpatrick et al. | 257/369 |

FOREIGN PATENT DOCUMENTS

DE 102007052167 A1 5/2009

OTHER PUBLICATIONS

Translation of Official Communication from German Patent Office for German Patent Application No. 10 2009 021 480.1-33 dated Mar. 26, 2010.

* cited by examiner

*Primary Examiner* — Long Tran
(74) *Attorney, Agent, or Firm* — Williams, Morgan & Amerson, P.C.

(57) ABSTRACT

In sophisticated SOI devices, the thickness of the active semiconductor layer in the N-channel transistor may be reduced compared to the P-channel transistor for a given transistor configuration, thereby obtaining a significant increase in performance of the N-channel transistor without negatively affecting performance of the P-channel transistor.

25 Claims, 8 Drawing Sheets

REDUCED SILICON THICKNESS OF N-CHANNEL TRANSISTORS IN SOI CMOS DEVICES

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures, according to an SOI (silicon-on-insulator) technique.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are and will be based on silicon devices due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions at least at the area in the vicinity of the channel region, i.e., source and drain extension regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence to obtain a high dopant concentration having a profile that varies laterally and in depth. The introduction of a high dose of dopants into a crystalline substrate area, however, generates heavy damage in the crystal structure, and therefore one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile. A defined degree of blurring may be advantageous for defining critical transistor properties, such as the overlap between the extension regions and the gate electrode. In other areas of the drain and source regions, that is, in deeper lying portions, the diffusion may result in a reduction of the dopant concentration at the corresponding PN junction areas, thereby reducing the conductivity in the vicinity of these areas. Thus, on one hand, a high anneal temperature may be desirable in view of a high degree of dopant activation, recrystallization of implantation-induced lattice damage and a desired diffusion at shallow areas of the extension regions, while, on the other hand, the duration of the anneal process should be short in order to restrict the degree of dopant diffusion in the deeper drain and source regions, which may reduce the dopant gradient at the respective PN junctions and also reduce the overall conductivity due to reducing the average dopant concentration. Therefore, for highly advanced transistors, the positioning, shaping and maintaining of a desired dopant profile are important properties for defining the final performance of the device, since the overall series resistance of the conductive path between the drain and source contacts may represent a dominant part for determining the transistor performance.

A further issue related to the lateral and vertical dopant profile of the drain and source regions and thus of the PN junctions may be presented by the overall capacitance of the PN junctions, which is roughly related to the effective interface formed by the PN junctions with respect to the remaining active region of the semiconductor device. In order to further enhance the performance of SOI transistors, the parasitic capacitance of the PN junctions may be significantly reduced by designing the vertical dopant profile in such a manner that a high dopant concentration is obtained that extends down to the buried insulating layer. In this way, only the laterally oriented interfaces of the PN junction of the drain and source regions contribute to the overall junction capacitance, while, additionally, the high dopant concentration extending down to the buried insulating layer provides the desired PN junction characteristics and also a reduced overall series resistance in the drain and source regions. However, providing deep drain and source regions with high dopant concentrations down to the buried insulating layer may require sophisticated implantation techniques, thereby contributing to the overall process complexity. In other cases, a moderately high dopant concentration at the buried insulating layer may be accomplished by adjusting the process parameters of the respective anneal processes in such a way that the diffusion of the dopants during the anneal process may result in the desired vertical dopant profile. The respective anneal parameters may, however, not be compatible with the requirement of a reduced transistor length, since a lateral diffusion, for instance in the extension regions, may also take place and result in a modified channel length, which may, therefore, require increased spacer widths to accommodate the increased diffusion activity during a respective anneal process. Thus, high temperature anneal processes with extended process times for inducing high diffusion activity and thus generating a high thermal budget may be a less attractive approach in view of increasing the packing density of sophisticated semiconductor devices. Consequently, the final performance of transistors in advanced SOI devices is a very complex combination of a plurality of factors, wherein the influence of many of these factors is difficult to be determined and wherein some of these factors may have a different effect on P-channel transistors and N-channel transistors.

Moreover, techniques have been recently developed in which the transistor performance, for instance the performance of P-channel transistors, may be significantly enhanced by providing a strained semiconductor material, such as a silicon/germanium compound, which may be formed in drain and source regions of silicon-based active transistor areas. The strained silicon/germanium compound, which may also be referred to as a silicon/germanium alloy, may be provided in a strained state due to a mismatch of the lattice spacing of natural silicon and natural silicon/germanium alloy. That is, the silicon/germanium material may be formed on the basis of the silicon lattice spacing, thereby resulting in a strained silicon/germanium crystal lattice, which may then interact with the neighboring semiconductor material to exert a stress and thus cause a certain strain. When providing the strained silicon/germanium alloy in the drain and source regions, the respective stress created by the strained material may act on the channel region of the transistor, thereby creating a respective compressive strain therein, which may enhance the charge carrier mobility. In highly scaled transistor devices based on the SOI architecture, significant benefits with respect to performance may be achieved by providing a highly strained semiconductor alloy in the vicinity of the channel region that extends along a significant portion in the depth direction in the semiconductor layer. Consequently, an efficient strain-inducing mechanism in SOI devices, in combination with a reduced parasitic junction capacitance, may result in an overall performance gain, while, additionally, a highly reduced thermal budget of the respective anneal processes may be desirable to provide the potential for reducing the lateral dimensions of the transistor devices, as explained above.

Upon a further device scaling, for instance according to the 45 nm MOSFET technology, the implant energy for forming the deep drain and source regions of SOI devices is substantially limited by the ion blocking capability of the gate electrode since the thickness of the semiconductor layer, and thus of the deep drain and source regions, is comparable to the height of the gate electrodes. Consequently, if a desired high dopant concentration is to be incorporated at a desired depth, for instance at the interface between the active semiconductor layer and the buried insulating layer in the SOI device, without using significant dopant diffusion, which may result in a reduced dopant concentration, as previously discussed, dopant species may also be incorporated in the channel region that is located below the gate electrode, thereby significantly deteriorating the transistor performance. In other words, if the implantation energy is selected moderately high so as to position the dopant species so as to extend to the buried insulating layer high concentration, thereby reducing the junction capacitance, the polysilicon gate electrode may not efficiently block the implantation species, thereby resulting in a non-desired degree of doping of the channel region. As a consequence, the resulting transistor performance is significantly affected by a plurality of interrelated factors, such as the thickness of the active semiconductor layer, the height of the gate electrodes, the lateral and vertical dopant profiles in the corresponding active regions of the transistor elements, the resulting dopant gradients at the PN junction, the effective overall size and shape of the PN junction and the like. Since the variation of one or more of these factors may involve a plurality of interrelated modifications of processes and components of the individual semiconductor devices, it is extremely difficult to introduce performance enhancing techniques that may result in a significant overall performance gain. For example, a plurality of performance enhancing mechanisms may be provided that may be targeted to enhance performance of one type of circuit element, such as N-channel transistors or P-channel transistors, without significantly negatively affecting the other type of circuit element, thereby contributing to an overall increase of performance of a complex SOI device including complementary transistors. For instance, one efficient technique for enhancing performance of P-channel transistors without significantly affecting the behavior of N-channel transistors is the provision of a compressive strain-inducing semiconductor alloy, as described above. On the other hand, a plurality of mechanisms, for instance with respect to the overall device geometry of P-channel transistors and N-channel transistors, may have a different influence on the total performance of an SOI device, in particular for sophisticated technology standards.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods in which performance of N-channel transistors may be enhanced, substantially without deteriorating performance of P-channel transistors, in order to obtain a significant overall gain in performance of advanced SOI devices. According to the principles disclosed herein, it has been recognized that, in advanced SOI semiconductor devices, the thickness of the active semiconductor layer may result in a significantly different change of performance of N-channel transistors and P-channel transistors. In this context, it has been determined that, with a reduction of the thickness of the semiconductor material for an otherwise substantially non-changed device geometry, an increase of performance of N-channel transistors may be obtained, while the P-channel transistors may exhibit a deteriorated behavior. For example, reducing the thickness of an active semiconductor layer for transistors generally corresponding to a technology node with a gate length of 50 nm and less may result in a gain of performance of approximately 2-3 percent, for instance with respect to the static behavior as represented by a transistor universal curve, while, on the other hand, performance of the corresponding P-channel transistors may deteriorate by approximately 5 percent. Similarly, the dynamic behavior, for instance represented by ring oscillator measurements, may indicate a significant enhancement for N-channel transistors while corresponding degradation of P-channel transistors may be observed. For instance, changes in transistor performance in the above-specified range may be obtained for a reduction of thickness of approximately 10 nm for an initial thickness of approximately 70-80 nm. Consequently, according to the principles disclosed herein, the thickness of the active regions of N-channel transistors may be selectively adjusted to a reduced value compared to the thickness of the active region of the P-channel transistors for a given overall device geometry so that an overall gain in device performance may be achieved since a deterioration of P-channel transistors may be substantially avoided.

One illustrative method disclosed herein comprises adjusting a first thickness of a first portion of a semiconductor layer that is formed on a buried insulating layer, wherein the first portion represents an active region of an N-channel transistor. The method further comprises adjusting a second thickness of a second portion of the semiconductor layer, wherein the second portion represents an active region of a P-channel transistor and wherein the first thickness is less than the second thickness. Additionally, the method comprises forming a first gate electrode structure above the active region of the N-channel transistor and forming a second gate electrode structure above the active region of the P-channel transistor. Finally, the method comprises forming drain and source regions in the active regions of the N-channel transistor and the P-channel transistor.

A further method disclosed herein relates to forming an SOI device. The method comprises reducing a thickness of a first portion of a semiconductor layer that is formed on a buried insulating layer, while an initial thickness of a second portion of the semiconductor layer is maintained, wherein the first portion represents an active region of an N-channel transistor and the second portion represents an active region of a P-channel transistor. Additionally, the method comprises forming a first gate electrode structure on the first portion having the reduced thickness and forming a second gate electrode structure on the second portion that has the initial thickness.

One illustrative semiconductor device disclosed herein comprises an N-channel transistor formed in and on a first active region that has a first thickness, wherein the N-channel transistor comprises a first gate electrode structure that is formed on the first active region. The semiconductor device further comprises a P-channel transistor formed in and on a second active region that has a second thickness greater than the first thickness, wherein the P-channel transistor comprises a second gate electrode structure formed on the second active region and wherein the first and second active regions are formed on a buried insulating material.

BRIEF DESCRIPTION OF THE DRAWINGS

The disclosure may be understood by reference to the following description taken in conjunction with the accompanying drawings, in which like reference numerals identify like elements, and in which:

FIGS. 1j-1l schematically illustrate cross-sectional views of the semiconductor device during various manufacturing stages in forming a sophisticated implantation profile of drain and source regions of the P-channel transistor by forming a cavity and subsequently implanting a P-type dopant species so as to extend to the buried insulating layer, according to illustrative embodiments.

Figure 1A:
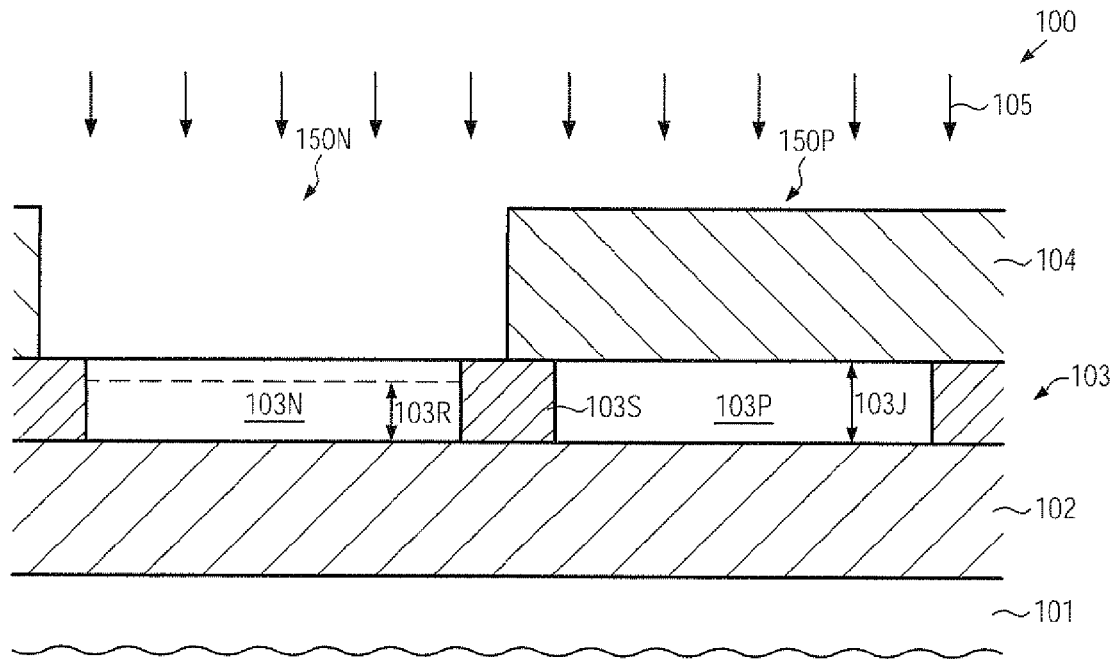
FIGS. 1a-1b schematically illustrate cross-sectional views of an SOI device during a manufacturing sequence in which the thickness of the active region of an N-channel transistor is selectively reduced with respect to the thickness of a P-channel transistor on the basis of an etch mask, which may also be used as an implantation mask, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to SOI semiconductor devices and manufacturing techniques in which the thickness of the active region of N-channel transistors may be selectively adjusted to be less than the thickness of the P-channel transistors for a given overall device geometry in order to significantly enhance performance of the N-channel transistor substantially without deteriorating the behavior of the P-channel transistor. For this purpose, in some illustrative embodiments, the initial thickness of a semiconductor layer may be selected so as to comply with the requirements of the P-channel transistor and the initial thickness may be selectively reduced for N-channel transistors using an appropriate masking regime and an etch process. In other illustrative embodiments disclosed herein, the semiconductor layer may be provided with an initial thickness that may comply with the requirements for enhanced performance of the N-channel transistor and an increase of the initial thickness may be accomplished by performing a selective epitaxial growth process in the active region of the P-channel transistor. Moreover, in some illustrative embodiments, the further processing for completing the transistor structure may be based on a gate electrode material having a planarized surface and thus having essentially the same height level for the N-channel transistor and the P-channel transistor so that the effective gate height of the N-channel transistor may be increased with respect to the effective gate height of the P-channel transistor. Consequently, due to the reduced thickness of the active semiconductor layer of the N-channel transistor, in combination with a resulting increased effective gate height, the ion blocking capability of the gate electrode structure is increased, thereby enabling the application of process parameters for implanting the N-type dopant species so as to extend to the buried insulating material, without unduly incorporating dopant species in the channel region. On the other hand, the relatively reduced height of the gate electrode of the P-channel transistor may result in a reduced fringing capacitance with respect to any contact elements, thereby contributing to superior performance of the P-channel transistor.

In still other illustrative embodiments, the manufacturing sequence for adjusting different thickness values for the active regions of the N-channel transistor and the P-channel transistor may be performed on the basis of an appropriate mask on the basis of an etch mask in the form of a resist mask or a growth mask in the form of a hard mask material, wherein the mask may also be used for incorporating a well dopant species into the exposed active region, thereby avoiding any additional lithography processes. Consequently, a significant enhancement of the SOI semiconductor device may be accomplished with a high degree of compatibility with conventional processes without adding significant process complexity to these manufacturing strategies. Moreover, in some illustrative embodiments disclosed herein, enhancement of P-channel transistors may be accomplished on the basis of the initially thicker active semiconductor layer by forming appropriate recesses and incorporating a P-type dopant species through the cavities so as to extend to the buried insulating material. Subsequently, any appropriate semiconductor material may be grown to refill the recesses and re-establish a desired thickness of the active semiconductor layer. For instance, in some illustrative embodiments, the incorporation of a dopant species may be performed prior to filling the cavities with a strain-inducing semiconductor alloy, such as a silicon/germanium alloy, which may induce a compressive strain in the channel region of the P-channel transistor, thereby further increasing performance of the SOI device.

FIG. 1a schematically illustrates a cross-sectional view of a semiconductor device 100 comprising a substrate 101 above which may be formed a semiconductor layer 103, such as a silicon-based semiconductor material, i.e., a semiconductor material comprising on average silicon contents of approximately 50 atomic percent and more. In other cases, the semiconductor layer 103 may be comprised of any other appropriate materials, such as germanium, silicon/germanium with a silicon fraction of less than 50 atomic percent and the like. Furthermore, the semiconductor device 100 may be considered as an SOI device, at least in the device region illustrated in FIG. 1a, and a buried insulating material 102 may be formed between the substrate 101 and the semiconductor layer 103. The buried insulating layer 102 may be comprised of any appropriate dielectric material or materials, such as silicon dioxide, silicon nitride, silicon oxynitride, high-k dielectric materials, low-k dielectric materials or combinations of any of these materials. In this respect, a low-k dielectric material is to be understood as a dielectric material having a dielectric constant of 3.0 or less. On the other hand, a high-k dielectric material is to be understood as a dielectric material having a dielectric constant of 10.0 and greater. As previously explained, in sophisticated SOI architectures, the semiconductor layer 103 having an appropriate material composition for a technology under consideration may be provided so as to comply with the overall design rules, for instance for forming therein and thereabove transistors having a gate length of approximately 50 nm and less. For example, an initial thickness, indicated as 103J, of the semiconductor layer 103 may be selected in the range of 50-100 nm, wherein, in the example shown, the initial thickness 103J may be selected so as to comply with the requirements of a P-channel transistor 150P to be formed in and above an active region 103P, which is formed in the semiconductor layer 103 on the basis of isolation structures 103S. The isolation structures 103S may be provided in the form of shallow trench isolations which may laterally separate the active region 103P from an active region 103N in and above which an N-channel transistor 150N may be formed, however, on the basis of a reduced thickness 103R of the active region 103N. For instance, in some illustrative embodiments, the reduced thickness 103R may amount to approximately 90-70% of the initial thickness 103J. As previously explained, for a corresponding difference in thickness between the active region 103N and the active region 103P for an otherwise given overall transistor configuration, a significant enhancement of the performance of the transistor 150N may be obtained.

The semiconductor device 100 as illustrated in FIG. 1a may be formed on the basis of any appropriate process strategies in order to provide the semiconductor layer 103 with the required thickness 103J, for instance on the basis of the above-specified thickness range. For this purpose, well-established wafer bond techniques, sophisticated ion implantation and oxidation processes and the like may be used in order to provide the substrate 101 including the buried insulating material 102 and the semiconductor layer 103, the initial thickness 103J of which may be further adapted by, for instance, epitaxial growth, planarization techniques and the like. Thereafter, the isolation structures 103S may be formed on the basis of well-established manufacturing techniques, including lithography, etch, deposition and planarization processes so as to fill corresponding isolation trenches with an appropriate dielectric material, such as silicon dioxide, silicon nitride and the like. Thereafter, a mask 104 may be formed above the semiconductor layer 103 so as to expose the active region 103N while covering the active region 103P. In one illustrative embodiment, the mask 104 may be provided as a resist material having an appropriate thickness to provide the required etch behavior and also act as an implantation mask for incorporating a desired well dopant species into the active region 103N in order to establish the basic conductivity type of the transistor 150N. For this purpose, well-established lithography techniques are available and may be applied. It should be appreciated that a sequence for incorporating N-type dopant species into the active region 103P may be performed on the basis of an appropriate mask prior to forming the mask 104, while, in other cases, the well dopant species for the active region 103P may be introduced after reducing the thickness of the active region 103N. In one illustrative embodiment, the semiconductor device 100 may be exposed to an etch ambient 105, which may be appropriately established in order to remove silicon material selectively with respect to the etch mask 104 and the isolation structure 103S. For this purpose, a plurality of selective etch recipes are well established in the art for silicon-based material and may be applied during the etch process 105. For example, plasma assisted processes on the basis of hydrogen bromide, fluorine, chlorine and the like may be used. In other cases, wet chemical etch recipes using appropriate bases, such as potassium hydroxide and the like, may be used for removing material of the active region 103N, thereby obtaining the desired reduced thickness 103R. It should be appreciated that, in some illustrative embodiments, when a corresponding material removal of the mask 104 results in significant thickness reduction, a corresponding implantation process for incorporating the well dopant species in the active region 103N may be performed prior to the etch process 105. In this case, the mask 104 may have its initial ion blocking capability in order to reliably prevent the P-dopant species from penetrating the active region 103P.

Figure 1B:
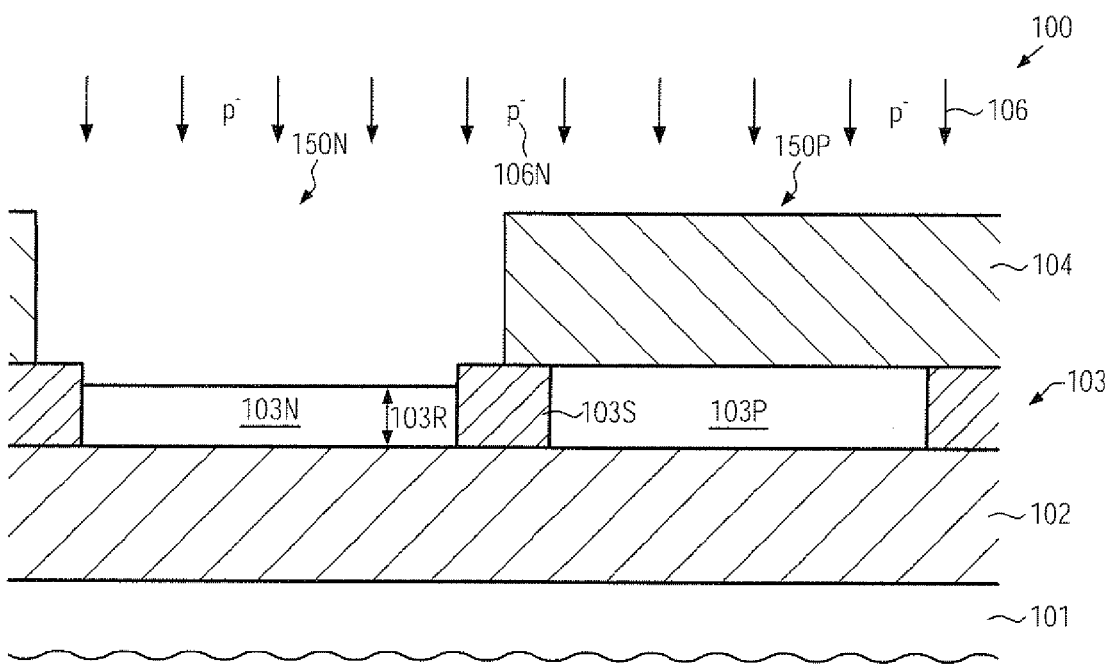

FIG. 1b schematically illustrates the semiconductor device 100 in a further advanced manufacturing stage according to one illustrative embodiment. As illustrated, the active region 103N may exhibit the reduced thickness 103R and may be exposed to an ion implantation process 106 in order to incorporate a well dopant species 106N, wherein appropriately selected implantation parameters with respect to energy and/or dose may be used for the reduced thickness 103R. For example, typically, a reduced implantation energy may be applied so that the mask 104 may still provide sufficient ion blocking capability, even if a certain degree of material erosion may have occurred during the preceding etch process 105 described in FIG. 1a. Consequently, by using the mask 104 for selectively reducing the thickness of the semiconductor layer 103 and for incorporating the well dopant species 106N for the transistor 150N, an additional lithography step may be avoided, thereby providing a high degree of compatibility with conventional manufacturing techniques without adding significant process complexity.

As described above, prior to the etch process 105 (FIG. 1a) or after incorporating the well dopant species 106N, an N-type dopant species may be incorporated into the active region 103P in order to establish the basic dopant concentration therein.

Figure 1C:
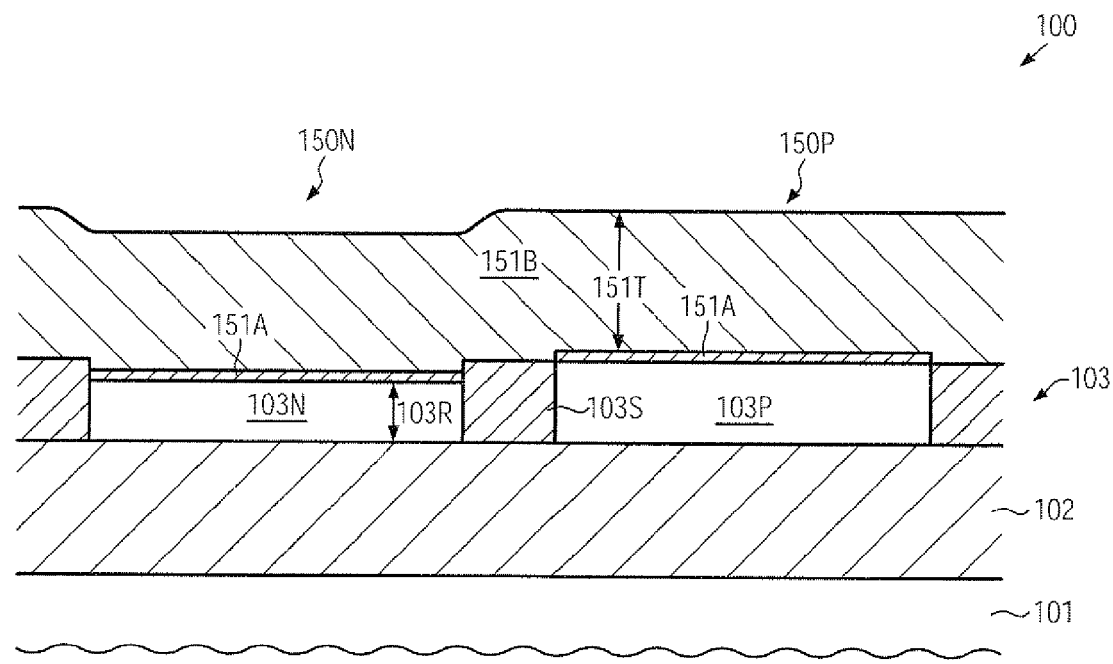
FIGS. 1c-1f schematically illustrate cross-sectional views of the SOI device during various manufacturing stages in patterning a gate electrode structure and completing the transistor configurations to obtain an increased gate height in the N-channel transistor, according to illustrative embodiments.

FIG. 1c schematically illustrates the semiconductor device 100 in a further advanced manufacturing stage in which a gate dielectric material 151A may be formed on the active regions 103N, 103P and possibly on the isolation structure 103S (not shown), depending on the type of material used and the corresponding process strategy. For example, the gate dielectric material 151A may comprise "conventional" dielectric materials, such as silicon dioxide, silicon nitride, silicon oxynitride and the like. In other cases, in addition or alternatively, the gate dielectric material may comprise sophisticated dielectric materials, also indicated as high-k dielectric materials, in order to obtain a high capacitive coupling for a given physical thickness of the dielectric material 151A. Furthermore, a layer 151B may be formed on the gate dielectric material 151A and may comprise one or more materials which may act as electrode materials. For example, the layer 151B may comprise a silicon material, for instance in the form of a polysilicon material, amorphous silicon and the like, which may act as an electrode after patterning the layer 151B. In other cases, any other appropriate material compositions may be used, as is required in view of obtaining the desired overall transistor configuration. The material layer 151B may, if required, comprise any additional materials, such as a cap layer, for instance in the form of a silicon nitride material, a silicon dioxide material and the like, which may be used for appropriate patterning of the layer 151B and for protecting integrity of an actual electrode material during the further processing, as will be explained later on in more detail. In still other illustrative embodiments, the layer 151B may comprise a metal-containing electrode material, typically in combination with a silicon material or a silicon/germanium material and the like. The dielectric material 151A and the electrode material 151B may be formed on the basis of any appropriate process technique. For example, sophisticated oxidation and/or deposition techniques may be used for forming the gate dielectric 151A, followed by the deposition of the one or more materials of the layer 151B, wherein, due to the surface topography caused by the reduced thickness 103R, a corresponding surface topography may be created in the layer 151B. Consequently, an initial thickness 151T of the material 151B may be substantially equal above the active region 103N and the active region 103P.

Figure 1D:
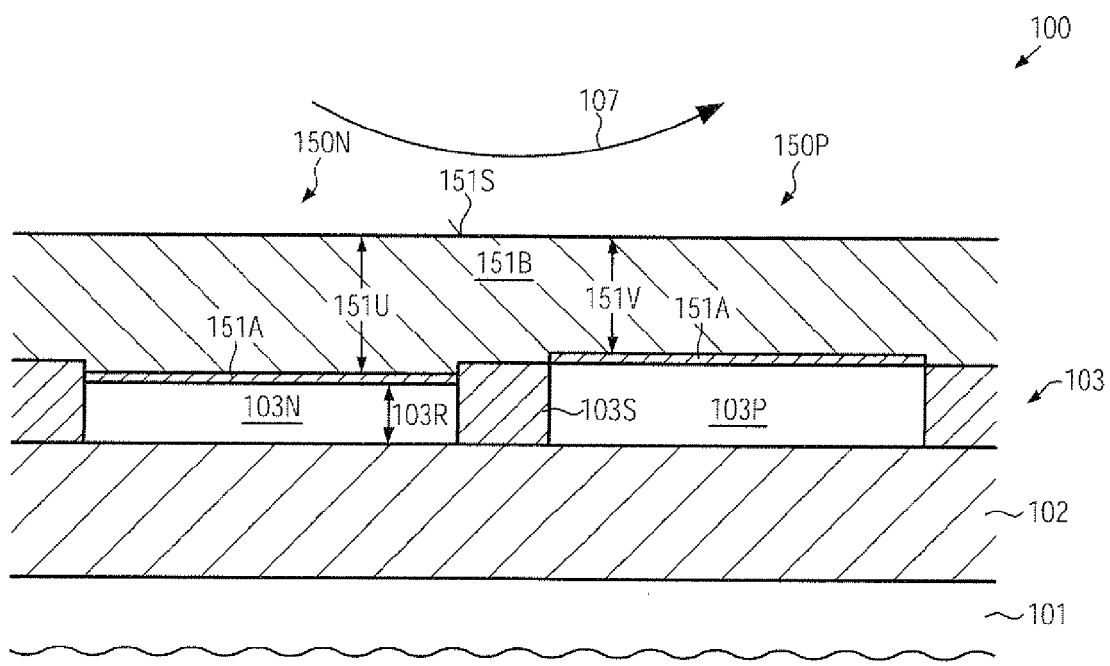

FIG. 1d schematically illustrates the semiconductor device 100 according to illustrative embodiments in which the device 100 may be subjected to a planarization process 107 in order to provide a planarized surface 151S of the material layer 151B. For example, the planarization process 107 may comprise a chemical mechanical polishing process during which the difference of the height level of the layer 151B may be substantially equalized. In other cases, any other appropriate planarization technique may be used, for instance appropriate etch techniques may be applied, possibly in combination with a planarization material that may be formed on the material layer 151B in a highly non-conformal manner. Consequently, after the planarization process 107, a thickness or height 151U of the electrode-containing material 151B above the active region 103N may be greater compared to the resulting height 151V of the layer 151B above the active region 103P. For instance, the height 151U may be selected so as to substantially comply with the design rules for the technology under consideration, thereby obtaining a reduced gate height, i.e. the height 151V, for the P-channel transistor 150P, which may be advantageous in view of a reduced fringing capacitance, as previously explained. Based on the planarized surface 151S, the further processing may be continued by patterning the layer 151B, for instance using well-established lithography and etch techniques.

Figure 1E:
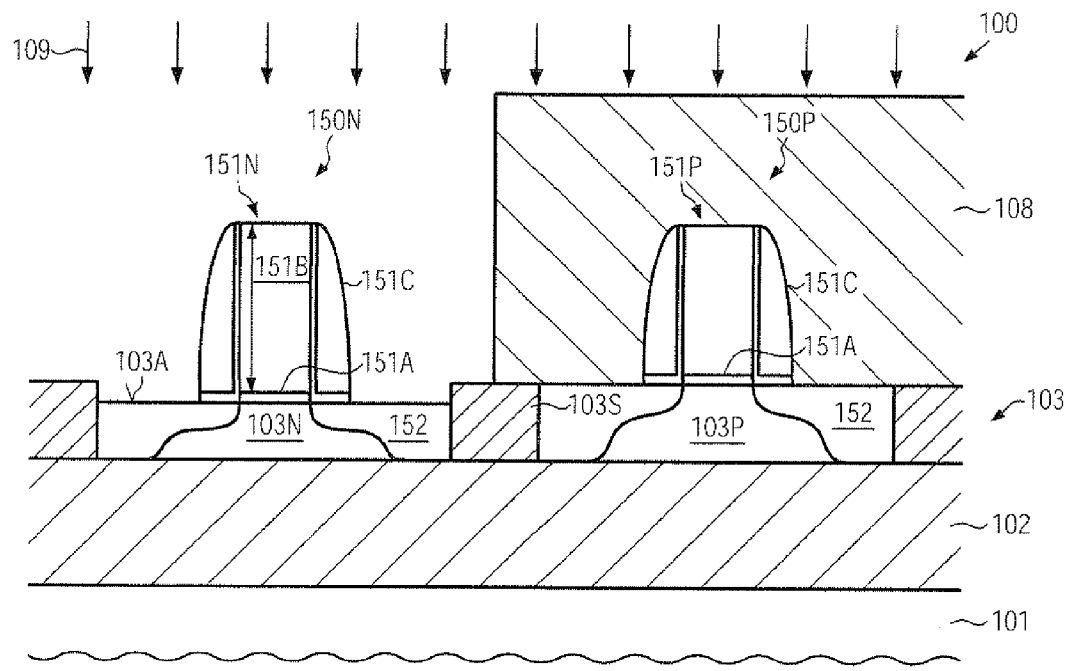

FIG. 1e schematically illustrates the semiconductor device 100 in a further advanced manufacturing stage. As illustrated, a first gate electrode structure 151N may be formed above the active region 103N and a second gate electrode structure 151P may be formed above the active region 103P. The gate electrode structures 151N, 151P may comprise an electrode material, i.e., at least a portion of the previously provided material 151B, wherein, for convenience, the gate electrode material may also be indicated as the material 151B. It should be understood, however, that a portion of the previously provided layer 151B (FIGS. 1c and 1d) may have been removed, for instance if a portion of the material 151C has initially been provided as a cap material, as will be explained later on in more detail. Due to a difference in height, the gate electrode structure 151N may have an increased height compared to the gate electrode structure 151P, wherein it should be understood that the term "height" is to be considered as referring to the corresponding surface 103A of the active regions 103N, 103P. On the other hand, the overall "height" of the transistors 150N, 150P, i.e., the vertical extension of the active regions and the corresponding gate electrode structure, may be substantially identical for both transistors. Moreover, the gate electrode structures 151N, 151P may comprise the gate dielectric material 151A having any appropriate composition and thickness, as previously explained. Moreover, the gate electrode structures 151N, 151P may have a length, i.e., in FIG. 1e, the horizontal extension of the gate electrode material 151B, which may be approximately 50 nm and less in sophisticated applications. It should be appreciated that, in some illustrative embodiments, the gate length may be selected differently for the transistors 150N, 150P, as will be explained later on in more detail.

Furthermore, in the manufacturing stage shown, a sidewall spacer structure 151C may be formed on sidewalls of the gate electrode material 151B. Additionally, drain and source regions 152 may be formed in the active regions 103N, 103P on the basis of an appropriate N-type dopant species and P-type dopant species, respectively.

The semiconductor device 100 as illustrated in FIG. 1e may be formed on the basis of the following processes. After patterning the material layer 151B, a portion of the spacer structure 151C may be formed, for instance, for defining a desired lateral offset of a portion of the drain and source regions 152 based on well-established masking regimes, corresponding dopant species may be incorporated, followed by forming one or more further spacer elements of the structure 151C in order to define a desired lateral offset to the electrode material 151B. In the embodiment shown in FIG. 1e, it may be assumed that an appropriate dopant profile for the drain and source regions 152 of the transistor 150P may have been established on the basis of the spacer structure 151C and thereafter an implantation mask 108 may be provided in order to cover the transistor 150P and expose the transistor 150N. Next, an implantation process 109 may be performed in order to complete the drain and source regions 152 by incorporating a desired high dopant concentration, which may extend down to a desired depth. As previously explained, superior performance may be obtained by "bottoming out" the drain and source regions 152, that is, by providing a high dopant concentration that extends to the buried insulating material 102. In conventional strategies, the implantation energy may typically be restricted to the ion blocking capability of the gate electrode, i.e., the thickness of the electrode material 151B, which may result in a significant drop of concentration towards the buried insulating material 102, wherein the bottoming out of dopant species may then be accomplished by an increased degree of dopant diffusion during subsequent anneal processes, as explained above. In the embodiments shown in FIG. 1e, the ratio between gate height and thickness of the active region 103N may be increased for a given gate height and, thus, for similar implantation energies compared to conventional devices, an increased penetration depth and thus an increased concentration at the buried insulating layer 102 may be accomplished. Consequently, relative to the active region 103N, an "increased" implantation energy may be used, thereby providing a desired high dopant concentration at the material 102, which may thus allow a reduced degree of dopant diffusion during subsequent anneal processes.

Figure 1F:
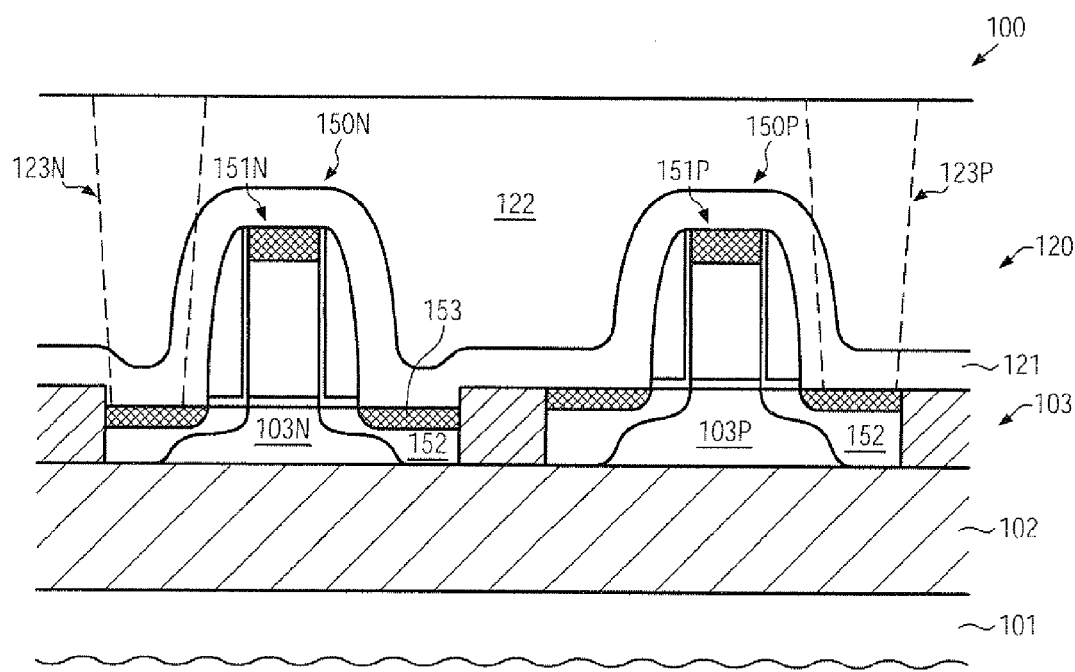

FIG. 1f schematically illustrates the semiconductor device 100 in a still further advanced manufacturing stage in which metal silicide regions 153 may be formed in the drain and source regions 152 and possibly in the gate electrode structures 151N, 151P. Moreover, an interlayer dielectric material 120, which may comprise two or more material layers 121, 122, may be formed so as to enclose the transistors 150N, 150P. For instance, the layer 121 may represent an etch stop layer, such as a silicon nitride material, while the layer 122 may be provided in the form of a silicon dioxide material and the like, depending on the overall process strategies. The metal silicide regions 153 may be formed on the basis of well-established process techniques after activating dopants in the drain and source regions 152 and reducing implantation-induced damage, wherein, as previously discussed, any appropriate anneal technique may be used. Thereafter, the etch stop layer 121 may be deposited, possibly as a highly stressed dielectric material, in order to enhance performance of one or both of the transistors 150N, 150P. Thereafter, the material 122 may be deposited and may be planarized, if required, in order to provide a superior surface topography for forming corresponding openings 123N, 123P for contact elements connecting to the transistors 150N, 150P, respectively. Due to the reduced height of the gate electrode structure 151P, the contact element 123P may result in a reduced fringing capacitance which may enhance performance of the P-channel transistor 150P. On the other hand, the N-channel transistor 150N may have a superior performance according to its static and dynamic behavior due to the reduced thickness of the active region 103N, as previously explained.

Figure 1G:
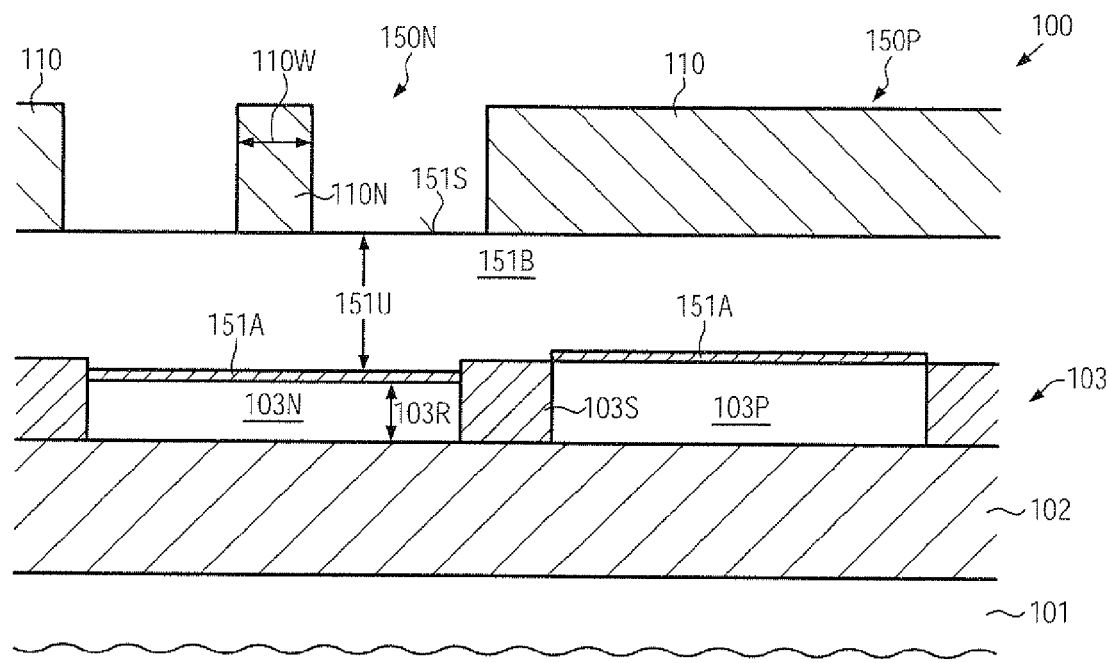
FIGS. 1g-1h schematically illustrate cross-sectional views of the SOI device in which gate electrode structures of the N-channel transistor and the P-channel transistor may be patterned on the basis of separate patterning sequences, according to further illustrative embodiments.
Figure 1H:
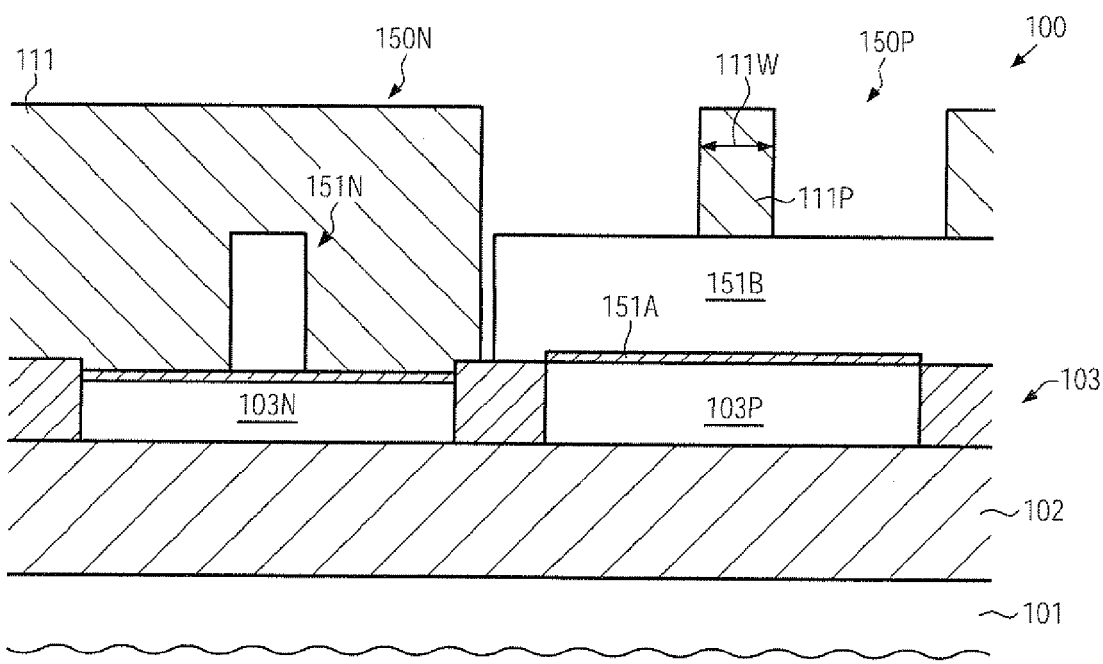

With reference to FIGS. 1g-1h, further illustrative embodiments will now be described in which the gate electrode structures for the transistors 150N, 150P may be formed in separate sequences if a difference in the effective thickness of the electrode material 151B is considered inappropriate.

FIG. 1g schematically illustrates the semiconductor device 100 in a state in which the electrode-containing material 151B may have the planarized surface 151S, as previously explained. Furthermore, a gate mask 110 may be formed above the electrode-containing material 151B in order to cover the transistor 150P while providing a gate mask feature 110N above the active region 103N. For this purpose, advanced lithography techniques may be used in which the width 110W of the mask feature 110N may be adjusted in accordance with overall design rules. Since the gate electrode structures for the transistors 150N, 150P may be formed during separate patterning sequences, an individual adjustment of the gate length of the transistors 150N, 150P may also be applied, if desired. Thereafter, the mask 110 may be used as an etch mask for patterning the material layer 151B, wherein the etch parameters may be specifically adapted to the increased effective thickness 151U. For instance, undue exposure of the gate dielectric material 151A to the corresponding etch ambient may be avoided and well-established recipes may be used.

FIG. 1h schematically illustrates the semiconductor device 100 in a further advanced manufacturing stage in which the gate electrode structure 151N is formed above the active region 103N and is covered by a mask 111, which may expose the material 151B above the active region 103P. Moreover, a gate mask feature 111P may be provided above the material 151B and may have any appropriate width 111W in order to adjust a desired gate length for the transistor 150P. With respect to forming the mask 111, the same criteria may apply as previously explained with reference to the mask 110 as described in FIG. 1g. Thereafter, a further etch process may be performed with an appropriately selected process parameter, for instance with respect to etch time, thereby also avoiding undue exposure of the gate dielectric material 151A. Consequently, undue material removal in the active regions 103N, 103P during the patterning sequences for forming the gate electrode structures may be avoided although a different thickness of the material 151B may be provided above the active regions 103N, 103P. Thereafter, the further processing may be continued, as described above.

Figure 1I:
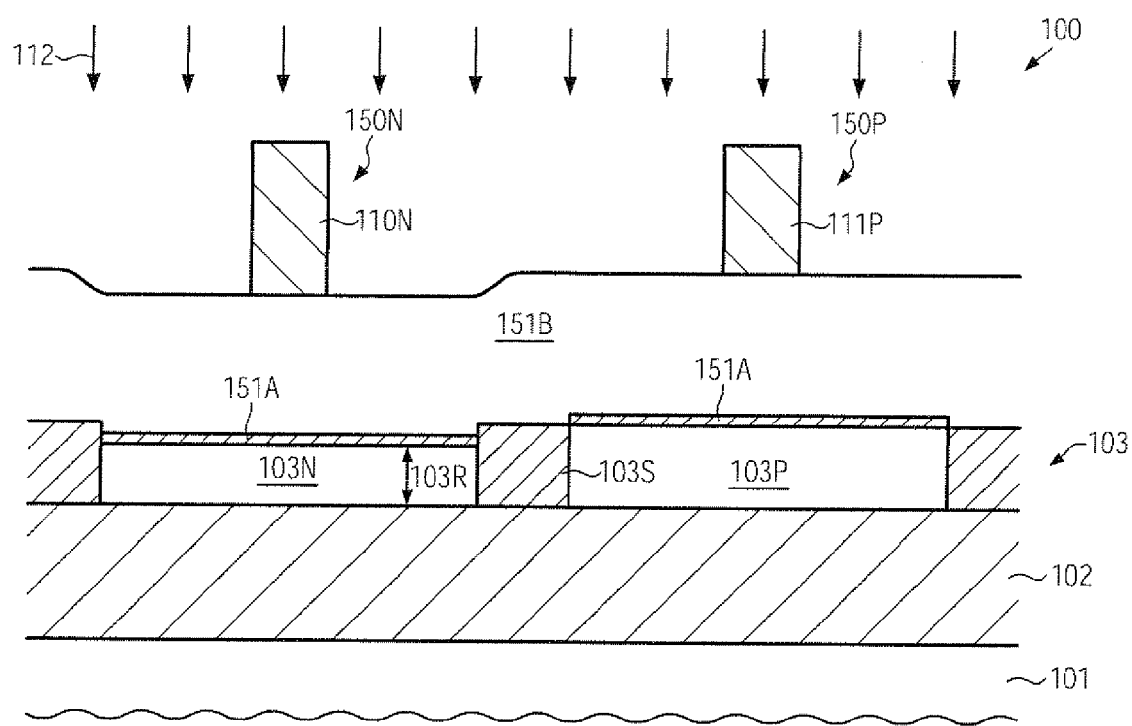
FIG. 1i schematically illustrates a cross-sectional view of the SOI device during a patterning sequence performed on the basis of a substantially equally thick electrode material above the active regions of the P-channel transistor and the N-channel transistor, according to illustrative embodiments.

FIG. 1i schematically illustrates the semiconductor device 100 according to a still further illustrative embodiment in which the electrode-containing material layer 151B may be patterned on the basis of the gate mask features 110N, 110P, which may be formed on the basis of a common exposure and patterning process. In this case, a high degree of flexibility in adjusting the individual gate length may be obtained. Furthermore, the material 151B may have substantially the same thickness above the active regions 103N, 103P so that, upon a patterning process 112, the corresponding gate electrode structures may be provided with the same height or thickness of the electrode-containing material layer 151B. Hence, the further processing may then be continued in a similar manner as described above, thereby providing a high degree of compatibility with conventional process strategies.

Figure 1J:
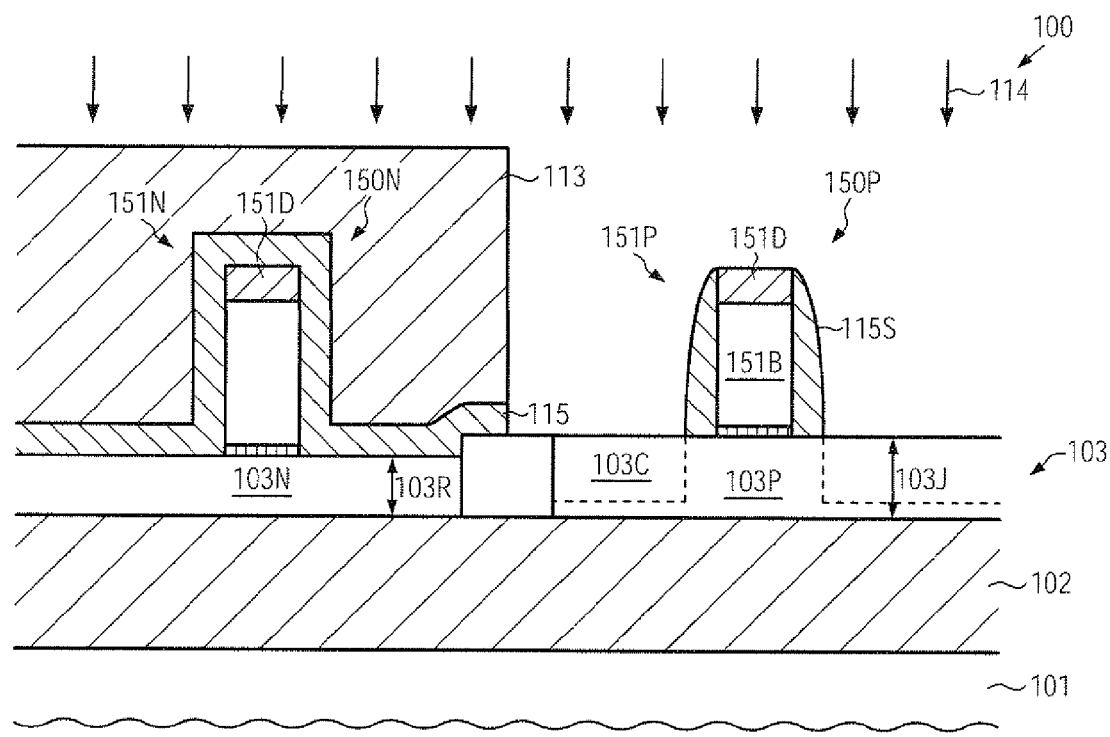

FIG. 1*j* schematically illustrates a cross-sectional view of the semiconductor device 100 according to still further illustrative embodiments in which additional performance enhancing mechanisms may be incorporated into the transistor 150P. In the manufacturing stage shown, the active region 103N may have the reduced thickness 103R, as previously explained, while the active region 103P may have the initial thickness 103J. Furthermore, the gate electrode structures 151N, 151P may comprise a cap layer 151D, such as a silicon nitride material and the like, so that the integrity of electrode material 151B of the gate electrode structure 151P may be ensured by the cap layer 151D in combination with a spacer element 115S. On the other hand, the gate electrode structure 151N and the active region 103N may be covered by a mask layer 115.

The semiconductor device 100 as illustrated in FIG. 1*j* may be formed on the basis of the following processes. After patterning the gate electrode structures 151N, 151P, which may include the cap materials 151D, the mask layer 115 may be deposited with a desired thickness. Thereafter, a mask 113, such as a resist mask, may be formed so as to cover the transistor 150N while exposing the transistor 150P to a sequence of etch processes 114 in order to first form the spacer element 115S and subsequently etch into the active region 103P, thereby forming cavities 103C that are laterally offset from the gate electrode structure 151P by the spacer elements 115S. It should be appreciated that, if desired, the mask 113 may be removed after forming the spacer element 115S and prior to forming the cavities 103C. The etch sequence 114 may be performed on the basis of well-established etch recipes.

Figure 1K:
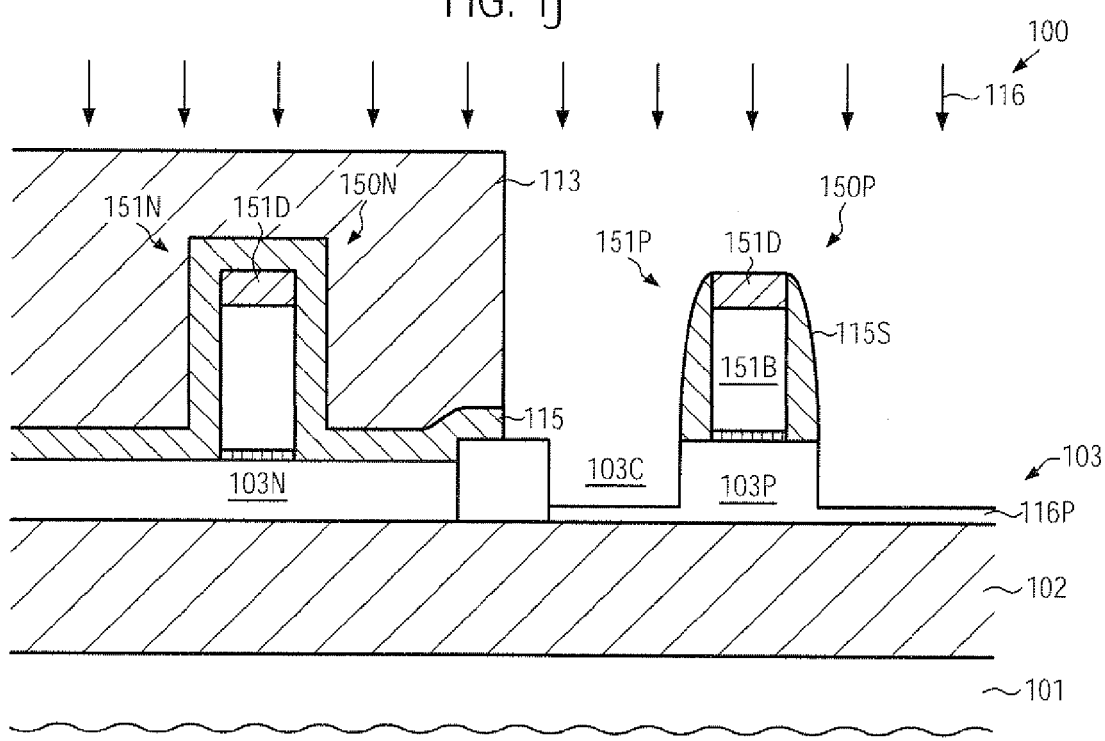
Figure 1I:
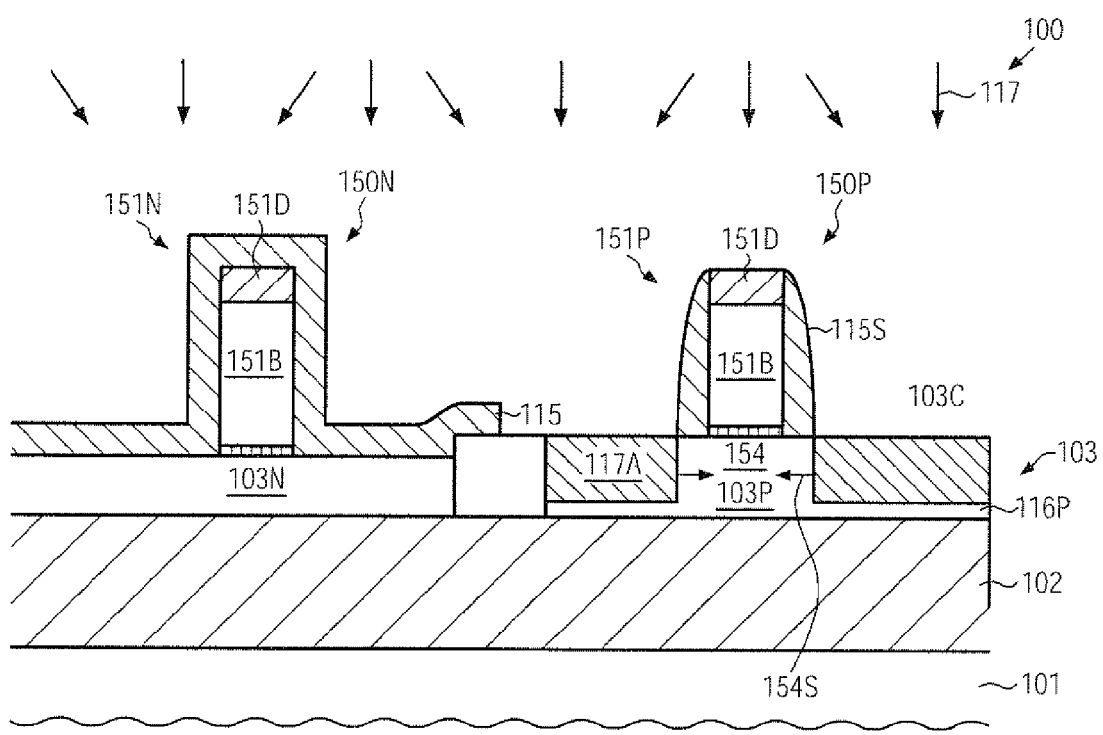

FIG. 1*k* schematically illustrates the semiconductor device 100 when exposed to an ion bombardment 116 in order to incorporate a P-type dopant species 116P through the cavities 103C into the remaining exposed portion of the active region 103P so that the dopant species 116P may extend to the buried insulating material 102. Thus, a desired high dopant concentration may be established at the bottom of the cavities 103C. Moreover, during the implantation process 116, a mask layer 115, possibly in combination with the mask 113, may act as an implantation mask so as to avoid penetration of the active region 103N for the P-type dopant species.

FIG. 1*l* schematically illustrates the semiconductor device 100 in a further advanced manufacturing stage in which a selective epitaxial growth process 117 may be performed so as to fill the cavities 103C (FIG. 1*k*) with a semiconductor material 117A, thereby re-establishing a desired thickness of the active region 103P. If desired, the semiconductor material 117A may be provided in the form of an in situ doped material, thereby contributing to enhanced overall dopant profile for the transistor 150P. In some illustrative embodiments, the semiconductor material 117A may be provided in the form of a strain-inducing semiconductor alloy, such as a silicon/germanium alloy, a silicon/germanium/tin alloy, a silicon/tin alloy and the like, in order to induce a compressive strain component 154S in a channel region 154 of the transistor 150P. In this manner, performance of the transistor 150P may be enhanced due to an increased charge carrier mobility in the channel region 154. Thereafter, the spacer element 151S, the mask layer 115 and the cap materials 151D may be removed and the further processing may be continued in a similar manner as is described above. Consequently, when providing the gate electrode structures with a different height or thickness, for instance by using a planarized surface after the deposition of the electrode-containing material layer, as previously discussed, an efficient bottoming out for the transistor 150N may be accomplished during the formation of drain and source regions, as described above, while an increased dopant concentration may be obtained at the buried insulating material 102 due to the incorporation of the P-type dopant species 116P.

Figure 1M:
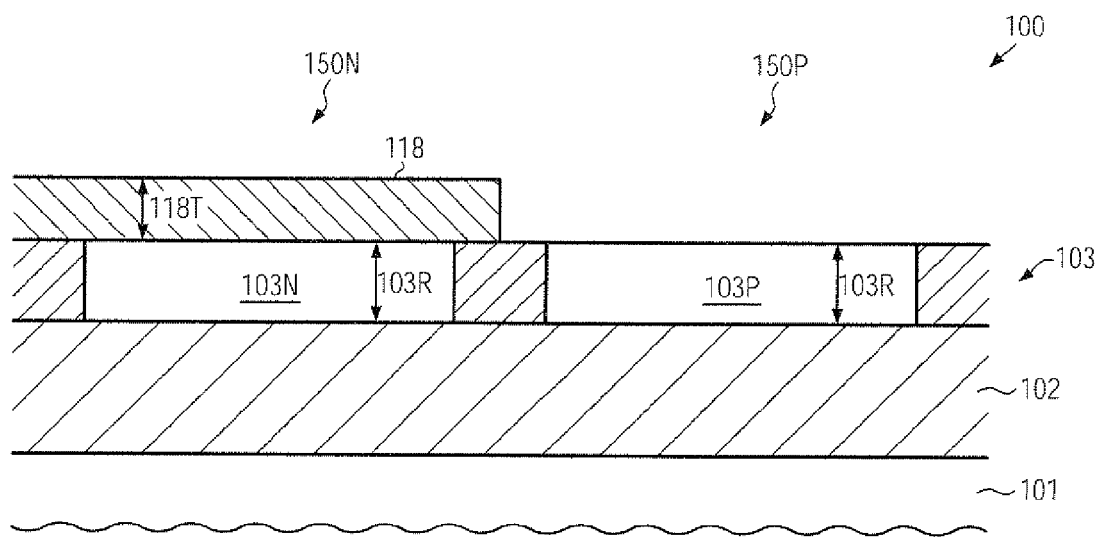
FIGS. 1m-1n schematically illustrate cross-sectional views during various manufacturing stages for adjusting the thickness of the active regions of the N-channel transistor and the P-channel transistor on the basis of a selective epitaxial growth process, according to still further illustrative embodiments.

FIG. 1*m* schematically illustrates the semiconductor device 100 according to further illustrative embodiments. As illustrated, the device 100 may comprise the active regions 103N, 103P with the reduced thickness 103R, which may correspond to a target thickness of the transistor 150N. Moreover, a mask 118 is provided above the active region 103N in order to act as a growth mask during a deposition process for increasing the reduced thickness 103R in the active region 103P. The mask 118 may be comprised of any appropriate material, such as silicon nitride and the like. In some illustrative embodiments, a thickness 118T may be selected so as to provide sufficient ion blocking capability in a later manufacturing stage for incorporating a well dopant species into the active region 103P. The mask 118 may be formed on the basis of any well-established deposition process, such as plasma enhanced chemical vapor deposition (CVD), thermally activated CVD and the like.

Figure 1N:
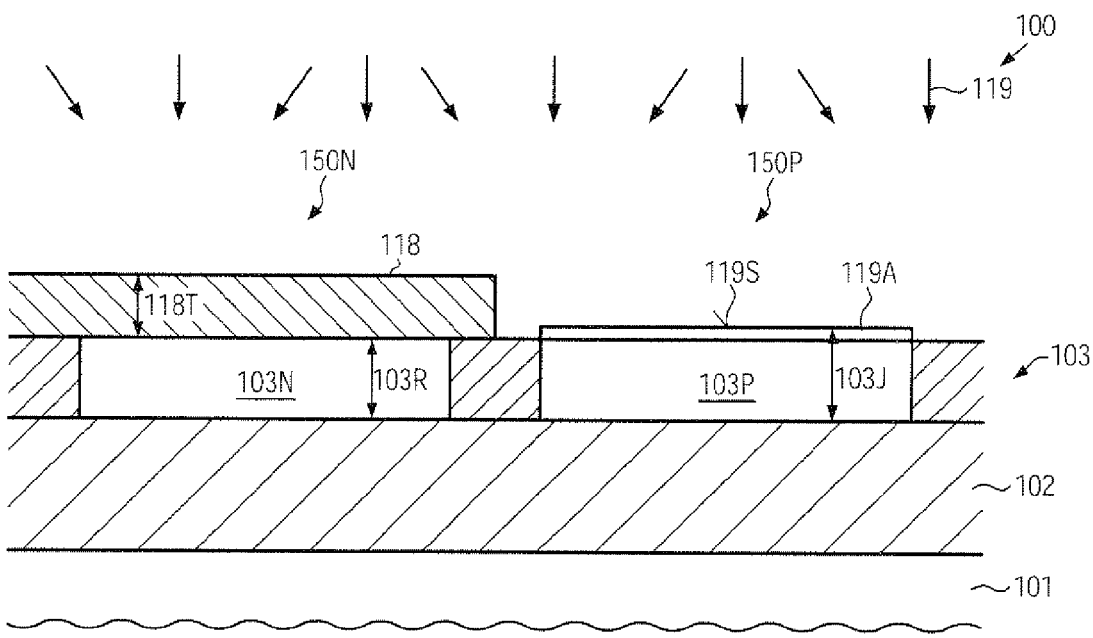

FIG. 1*n* schematically illustrates the semiconductor device 100 when exposed to a deposition ambient 119, which may be established on the basis of process parameters that provide a selective deposition of a semiconductor material 119A on exposed crystalline surface areas, i.e., the active region 103P, while substantially suppressing material deposition on dielectric surface areas. The semiconductor material 119A, which may be comprised of any desired material composition, such as silicon, silicon/germanium and the like, may be formed with an appropriate thickness so as to obtain a target thickness 103J that is appropriate for the transistor 150P. For instance, the material 119A may be provided with a thickness of approximately 5-50 nm in order to obtain a desired target thickness for the P-channel transistor 150P. In one illustrative embodiment, at least a surface 119S of the additional semiconductor material 119A may be comprised of the same material as the active region 103P, thereby providing similar conditions during the further processing, i.e., during the formation of a gate dielectric material on the active regions 103N, 103P. Consequently, the further processing may be continued on the basis of the different thickness values 103R, 103J in order to obtain a significant enhancement of performance of the transistor 150N, as previously explained. In some illustrative embodiments, the further processing may be continued by incorporating a well dopant species into the active region 103P by using the mask 118 as an implantation mask. Consequently, in this case, an additional lithography step for providing the different thickness values of the active regions 103N, 103P may be avoided with respect to conventional process strategies.

As a result, the present disclosure provides semiconductor devices and manufacturing techniques in which the thickness of an active region of an N-channel transistor in an SOI device may be reduced with respect to a target thickness of a P-channel transistor, thereby significantly enhancing the dynamic and static behavior of the N-channel transistor. Moreover, in some illustrative embodiments, additional lithography steps may be avoided by using an etch mask or a growth mask also as an implantation mask for defining the basic doping concentration in a respective active region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
adjusting a first thickness of a first portion of a semiconductor layer, said semiconductor layer being formed on a buried insulating layer, said first portion representing an active region of an N-channel transistor;
adjusting a second thickness of a second portion of said semiconductor layer, said second portion representing an active region of a P-channel transistor, said first thickness being less than said second thickness;
forming a first gate electrode structure above said active region of said N-channel transistor;
forming a second gate electrode structure above said active region of said P-channel transistor, wherein said first and second gate electrode structures each comprise a respective, effective height that is approximately equal; and
forming drain and source regions in said active regions of said N-channel and P-channel transistors.

2. The method of claim 1, wherein adjusting said first thickness and said second thickness comprises forming a mask so as to expose said first portion and cover said second portion and reducing an initial thickness of said first portion of the semiconductor layer by using said mask.

3. The method of claim 2, further comprising introducing a well dopant species into said active region of said N-channel transistor by using said mask as an implantation mask.

4. The method of claim 3, wherein said well dopant species is introduced after reducing said initial thickness of said first portion.

5. The method of claim 1, wherein adjusting said first thickness and said second thickness comprises forming a mask so as to cover said first portion and expose said second portion and selectively forming a semiconductor material above said active region of said P-channel transistor.

6. The method of claim 5, further comprising introducing a well dopant species into said active region of said P-channel transistor by using said mask as an implantation mask.

7. The method of claim 1, wherein forming said first and second gate electrode structures comprises forming a gate dielectric material, forming at least one electrode material on said gate dielectric material and patterning said at least one electrode material so as to form said first and second gate electrode structures, wherein a thickness of said at least one electrode material is substantially equal in said first and second gate electrode structures.

8. The method of claim 1, wherein forming said first and second gate electrode structures comprises forming a gate dielectric material, forming at least one electrode material on said gate dielectric material, performing a planarization process so as to form a planarized surface and patterning said at least one electrode material on the basis of said planarized surface.

9. The method of claim 8, wherein patterning said at least one electrode material comprises forming a gate electrode mask above said active region of said N-channel transistor and said active region of said P-channel transistor and performing an etch process so as to concurrently pattern said at least one electrode material of said first and second gate electrode structures.

10. The method of claim 8, wherein patterning said at least one electrode material comprises forming a first gate electrode mask above one of said active region of said N-channel transistor and said active region of said P-channel transistor while masking said at least one electrode material above the other one of said active region of said N-channel transistor and said P-channel transistor, and patterning said at least one electrode material on the basis of said first gate electrode mask.

11. The method of claim 8, wherein forming drain and source regions of said N-channel transistor comprises implanting an N-type dopant species so as to extend to said buried insulating layer.

12. The method of claim 8, wherein forming drain and source regions of said P-channel transistor comprises forming cavities in said second active region laterally offset from said second gate electrode structure, implanting a P-type dopant species so as to extend to said buried insulating layer and filling said cavities with a semiconductor material.

13. The method of claim 12, wherein said semiconductor material comprises a strain-inducing semiconductor alloy.

14. A method of forming an SOI device, comprising:
reducing a thickness of a first portion of a semiconductor layer that is formed on a buried insulating layer while maintaining an initial thickness of a second portion of said semiconductor layer, said first portion representing an active region of an N-channel transistor and said second portion representing an active region of a P-channel transistor; and
forming a first gate electrode structure on said first portion having said reduced thickness and a second gate electrode structure on said second portion having said initial thickness, wherein said first and second gate electrode structures each comprise a respective, effective height that is approximately equal.

15. The method of claim 14, wherein reducing a thickness of said first portion comprises forming a mask so as to cover said second portion and expose said first portion and performing an etch process using said mask as an etch mask.

16. The method of claim 15, further comprising introducing a well dopant species into said first portion by using said mask as an implantation mask.

17. The method of claim 14, wherein forming said first and second gate electrode structures comprises forming a gate dielectric material on said first and second portions, forming an electrode material above said gate dielectric material, performing a planarization process so as to provide a planarized surface and patterning said electrode material on the basis of said planarized surface.

18. The method of claim 17, wherein patterning said electrode material comprises performing a first masking and patterning sequence to form one of said first and second gate electrode structures and performing a second masking and patterning sequence to form the other one of said first and second gate electrode structures.

19. The method of claim 17, further comprising forming drain and source regions of said N-channel transistor in said first portion by implanting an N-type dopant species so as to extend to said buried insulating layer.

20. The method of claim 19, further comprising forming drain and source regions of said P-channel transistor by forming cavities in said second portion laterally offset from said second gate electrode structure, introducing a P-type dopant species so as to extend to said buried insulating layer and forming a semiconductor material in said cavities.

21. The method of claim 20, wherein said semiconductor material comprises a strain-inducing semiconductor alloy.

22. A semiconductor device, comprising:
   an N-channel transistor formed in and on a first active region having a first thickness, said N-channel transistor comprising a first gate electrode structure formed on said first active region; and
   a P-channel transistor formed in and on a second active region having a second thickness that is greater than said first thickness, said P-channel transistor comprising a second gate electrode structure formed on said second active region, said first and second active regions formed on a buried insulating material, wherein said first and second gate electrode structures each comprise a respective, effective height that is approximately equal.

23. The semiconductor device of claim 22, wherein a thickness of an electrode material of said first gate electrode structure is greater than a thickness of an electrode material of said second gate electrode structure.

24. The semiconductor device of claim 22, wherein a length of said first and second gate electrodes is approximately 50 nm or less.

25. The semiconductor device of claim 24, wherein said N-channel transistor further comprises drain and source regions, at least one of which extends to said buried insulating material with an N-type dopant concentration that is approximately $10^{21}$ atoms per $cm^3$ or higher.

* * * * *